United States Patent [19] [11] Patent Number: 4,862,245
Pashby et al. [45] Date of Patent: Aug. 29, 1989

[54] PACKAGE SEMICONDUCTOR CHIP

[75] Inventors: Richard P. Pashby, Williston; Douglas W. Phelps, Jr., Burlington; Sigvart J. Samuelsen, Burlington; William C. Ward, Burlington, all of Vt.

[73] Assignee: International Business Machines Corporation, Armonk, N.Y.

[21] Appl. No.: 161,319

[22] Filed: Feb. 19, 1988

Related U.S. Application Data

[63] Continuation of Ser. No. 940,235, Dec. 8, 1986, abandoned, which is a continuation of Ser. No. 724,736, Apr. 18, 1985, abandoned.

[51] Int. Cl.$^4$ ............................................ H01L 23/48
[52] U.S. Cl. ........................................ 357/70; 357/68; 357/71; 357/72; 357/80; 357/81; 357/84
[58] Field of Search ....................... 357/68, 70, 71, 72, 357/80, 81, 84

[56] References Cited

U.S. PATENT DOCUMENTS 3,959,579  5/1976  Johnson ............................ 174/68.5
4,246,595  1/1981  Noyori et al. ........................ 357/70
4,494,217  1/1985  Suzuki et al. ......................... 357/84

OTHER PUBLICATIONS

Semiconductor International, Sep. 1982, pp. 111-124.
Semiconductor International, Apr. 1985.
Hitachi Cable, Ltd. DaiNippon.
Tamagawa Metal & Machinery Co., Ltd.

Primary Examiner—Edward J. Wojciechowicz
Attorney, Agent, or Firm—Francis J. Thornton; Theodore E. Galanthay; Michael J. Weins

[57] ABSTRACT

The present invention is directed to a packaged semiconductor chip which effectively dissipates heat and has improved performance. The packaged chip has a plurality of lead frame conductors extending through the encapsulating material which are adhesively joined to the semiconductor chip, preferably by means of an alpha barrier. The conductors cover a substantial portion of the surface of the chip and thereby serve as conduits for the dissipation of heat from the chip. Wires are bonded to the conductors and extend from the conductors to the terminals on the semiconductor chip. In a preferred embodiment the semiconductor chip terminals are located along a center line of the chip. This allows for short connecting wires which is turn contribute to faster chip response.

20 Claims, 4 Drawing Sheets

PACKAGE SEMICONDUCTOR CHIP

This is a continuation of Ser. No. 940,235 filed Dec. 8, 1986, which was a Continuation of Ser. No. 724,736 filed Apr. 18, 1985, now abandoned.

BACKGROUND OF THE INVENTION

1. Field of the Invention

This invention relates to a packaged semiconductor chip having resistance to ingress of environmental contaminants, capability to make electrical contact to chip terminals remote from the chip periphery and further, to a package which contains an alpha barrier, conserves precious metal, is easily assembled and results in an encapsulated chip with enhanced electrical, mechanical and thermal performance.

2. Description of the Prior Art

Several techniques have been employed to position and affix leads to semiconductor chips prior to encapsulation of the chip in a protective coating.

Current techniques employ a lead frame with a central tab to which the semiconductor chip is attached prior to encapsulation. As described herein at the beginning of the "Description of Preferred Embodiments" section with reference to Prior Art FIGS. 1 and 2, it is known in the prior art to connect terminal pads near the periphery of a semiconductor chip to corresponding fingers of a lead frame.

A common problem with the prior art semiconductor packages has been cracking along the mold parting line where the metal lead frame leads exit. Another problem has been the relatively short path for ingress of environmental contaminants along the metal leads from outside the package to the semiconductor chip. A still further problem has been an inability to reliably form conductors from the fingers of the metal lead frame to chip terminal pads located within the chip surface remote from the periphery of the chip. Moreover, the relatively long wire bond leads required to connect the metal leads to the chip terminals do not permit the crossing of wire bond leads for alternate I/O terminal assignment.

SUMMARY OF THE INVENTION

It is an object of this invention to provide a packaged semiconductor chip with improved mechanical, electrical and thermal performance.

Another object of the invention is to provide a packaged semiconductor chip with the capability of connecting lead frame conductors to different chip terminals, thereby permitting the use of the same package with different semiconductor chips.

Still another object of the invention is to provide a packaged chip with an alpha barrier.

It is another object of the invention to provide a packaged semiconductor chip which conserves precious metal such as gold or silver.

It is a further object of the invention to provide a semiconductor chip in a package with a reduced size while maintaining relatively long lead frame path lengths thus limiting the ingress of corrosive environmental contaminants.

It is still another object of the invention to provide lead frame conductors which have a large portion of the path length encapsulated in the packaging material.

It is another object of the invention to provide a packaged semiconductor chip with package integrity.

It is yet another object of the present invention to provide a semiconductor package with enhanced package seal reliability.

These and other objects of the present invention are provided by a lead frame having a plurality of conductors. The lead frame is attached adhesively to a major surface of a semiconductor chip. As a preferred embodiment, a dielectric layer, typically an alpha barrier, is interposed between the lead frame and the chip and adhesively joined to both of them. As described later, a different adhesive may be used to attach the alpha barrier to the chip and to the lead frame. Wires connect terminals on the semiconductor chip and the lead frame conductors. The lead frame, alpha barrier, semiconductor chip, and wires which connect the semiconductor terminals to the lead frame conductors are encapsulated to form a semiconductor module.

The packaged semiconductor chip of the present invention is comprised of a semiconductor chip which is adhesively attached to an alpha barrier and said alpha barrier is adhesively attached to the lead frame conductors. Wires run from the lead frame conductors to terminals on the semiconductor chip. The semiconductor, alpha barrier and conductors are embedded in an encapsulating material.

Preferably the lead frame conductors are brought in close proximity to terminals located along the center of the semiconductor chip and are electrically connected to the semiconductor chip by means of short wire bonds.

In another preferred embodiment a bus bar is provided. The bus bar serves both as a terminal strip and as a means for dissipating heat.

These and other objects, features and advantages of the invention will be apparent from the following more particular description of the preferred embodiments of the invention as illustrated in the accompanying drawings.

DESCRIPTION OF THE PREFERRED EMBODIMENTS

Figure 1:
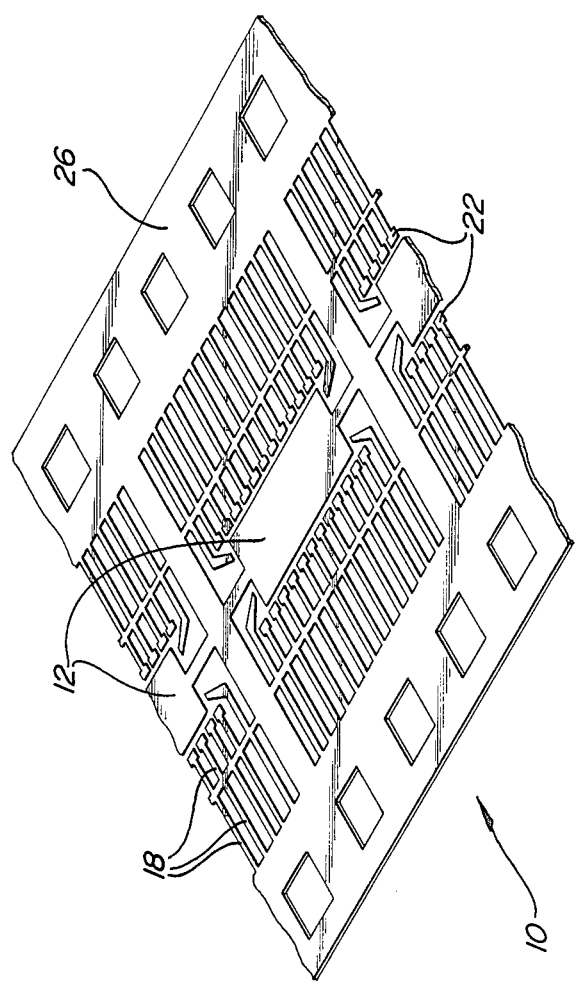
FIG. 1 is a schematic representation of a prior art lead frame.
Figure 2:
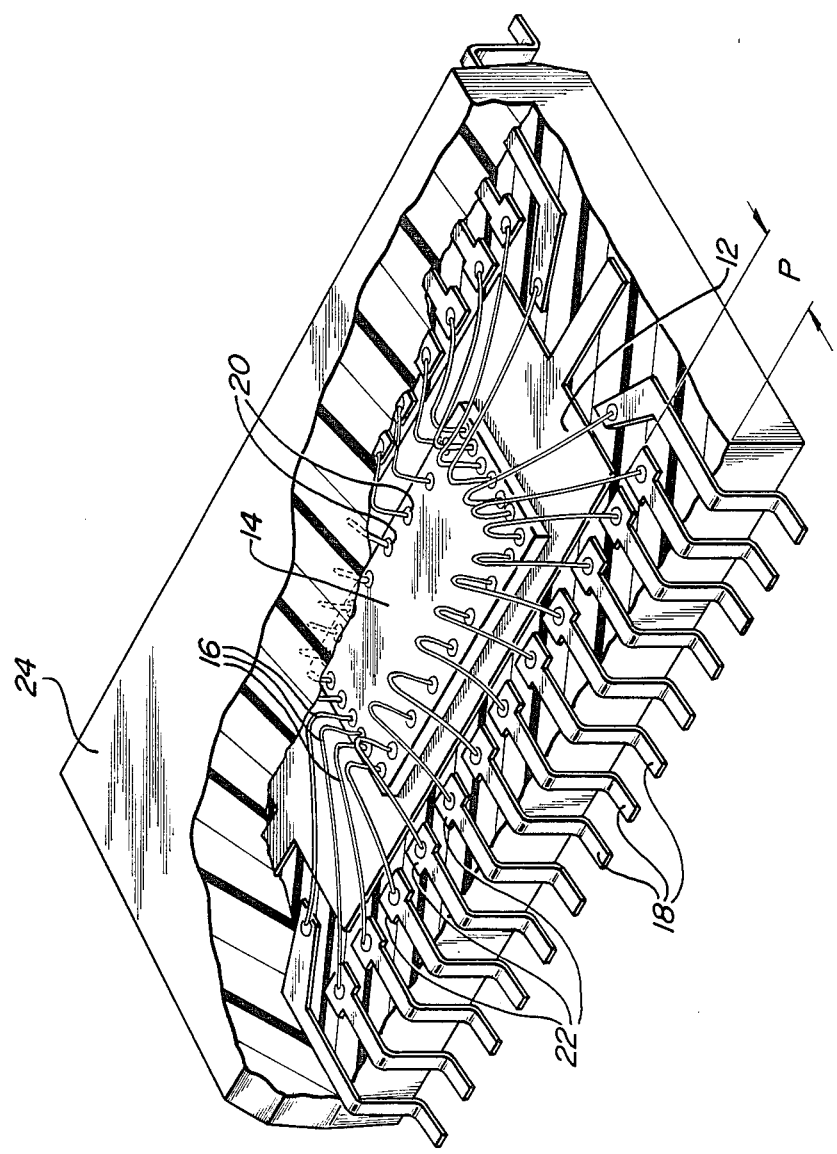
FIG. 2 is a schematic representation of a wire bonded encapsulated semiconductor chip employing the prior art lead frame of FIG. 1. Part of the encapsulation material has been broken away to expose the conductors, the support tab, the semiconductor chip, the chip terminals, and the wires used to connect the conductors to the chip terminals.

A prior art lead frame and an encapsulated semiconductor chip are shown in FIGS. 1 and 2. The conductor lead frame 10 has a central support tab 12. The central support tab 12 supports and positions the semiconductor chip 14 for stability during subsequent wire bond and encapsulation operations. When using the conductor lead frame 10 shown in FIG. 1 long connecting wires 16, as shown in FIG. 2, connect the lead frame conductors 18 and chip terminals 20.

During encapsulation in packaging material 24 the conductors 18 and central support tab 12 are supported by the lead frame selvage 26 shown in FIG. 1. After the encapsulation the lead frame selvage 26 is removed. Because a minimum path length of about 0.5 mm to 1 mm is needed to assure sealing of the conductors in the encapsulating material the width of the semiconductor module must be 1–2 mm larger than the width of the chip 14.

Because the conductors 18 have a short path P within the encapsulating material 24 the conductors 18 terminate in anchors 22 to assure package integrity. The anchors 22 while providing support for the conductors 18 reduce the bonding area between the upper and lower segments of the encapsulating material. Because of the straight path from the edge of the package to the anchors 22, a short straight path is provided for ingress of corrosive environmental contaminants.

Prior to encapsulation, the semiconductor chip 14 is attached to the central support tab 12. This is frequently done by means of an epoxy resin glue. The long wires 16 which connect the conductors 18 to chip terminals 20 are typically 100 mils long. Since these long wires 16 are very fine, they have a relatively high impedance and thus reduce the electrical performance of the integrated circuits embedded in semiconductor chip 14 and limit the response times. The long wires 16 are required because the lead frame conductors 18 must be spaced away from the relatively large support tab 12 and chip 14.

The central support tab 12 and large portions of the conductors 18 are typically gold or silver plated. In part, because of the large area of the central support tab 12 which can not economically be masked during plating, relatively large quantities of precious metal are required.

Furthermore, since the semiconductor chip 14 is isolated from the surroundings by the encapsulating material, heat generated by the chip is not readily dissipated which results in higher operating temperatures and a reduced semiconductor chip life.

Figure 3:
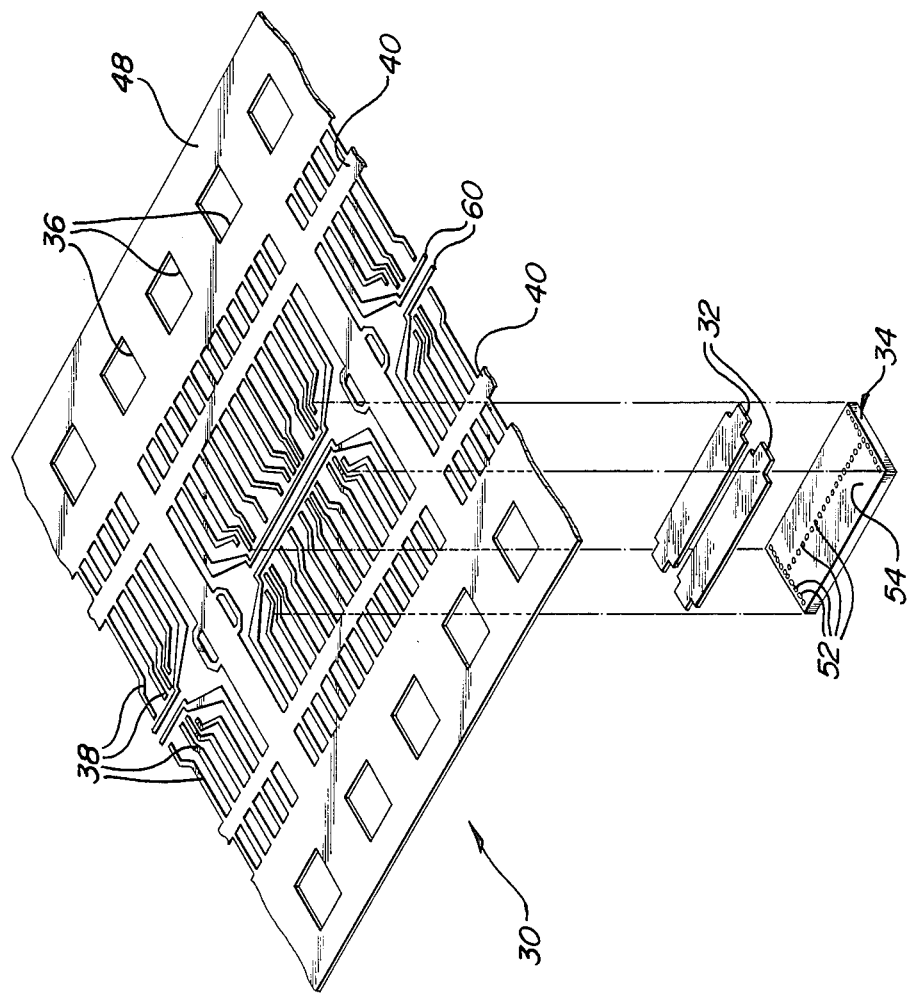
FIG. 3 is an exploded schematic representation for one embodiment of the present invention showing the spacial relation between the chip, the alpha barrier and the lead frame for one embodiment of the present invention.

FIG. 3 is a schematic representation of an exploded view of a lead frame 30, an alpha barrier 32 and a semiconductor chip 34 showing the spacial relationship of these elements for one embodiment of the present invention. The lead frame 30 is produced from metal sheet stock and is provided with indexing holes 36. The sheet stock is preferably a copper alloy. The interior portion of the lead frame 30 contains the lead frame conductors 38. The portion of the conductors 38 which extends over the semiconductor chip 34 is separated from semiconductor chip 34 by the alpha barrier 32.

The alpha barrier 32 is a polymeric film having a melting temperature in excess of 175° C. and does not contain ionizable species such as halides and active metals including Na, K and P. Polyimide films can be used as alpha barriers as suggested in U.S. Pat. No. 4,426,657 by Abiru, Sugimoto, and Inomata. One such polyimide film is Dupont Kapton TM.

The semiconductor chip 34 is attached to the lead frame conductors 38 by an adhesive layer not shown. A thin layer of adhesive is applied to the lead frame conductors or the top active surface. The top active surface is one of the major surfaces of the chip. To avoid any possibility of short circuit to the chip in spite of the fact that the chips are usually coated with a passivating/insulating material, it is preferable to use a dielectric interposer. It is preferred that the dielectric interposer be an alpha barrier 32 positioned between the conductor and the chip. The adhesive layer can then be applied to both surfaces of the alpha barrier 32 with different adhesive materials used for each surface.

To effectively serve as an alpha barrier while still allowing for effective heat transfer the alpha barrier 32 should be between about 1.5 and 2 mils thick.

The semiconductor chip 34 is attached to the alpha barrier 32 by a first adhesive layer. The first adhesive layer is selected from the group of epoxies, acrylics, silicones and polyimides with silicones being preferred since they minimize corrosion.

The second adhesive layer attaches the alpha barrier 32 to the conductors 38 and is selected from the group of epoxies, acrylics, silicones and polyimides. Preferably the second adhesive layer is selected from the group of epoxies and acrylics since these materials assure that the conductors 38 are fully bonded to the alpha barrier 32, thereby enhancing the thermal conductivity between the semiconductor chip 34 and the conductors 38, and mechanically locking the lead frame conductors 38 to the semiconductor chip 34.

Cross members 40 are provided between the conductors 38 of the lead frame 30 to impart rigidity to the lead frame 30 and to limit flow of the encapsulating material when the semiconductor chip 34, alpha barrier 32, and conductor 38 are encapsulated.

Figure 4:
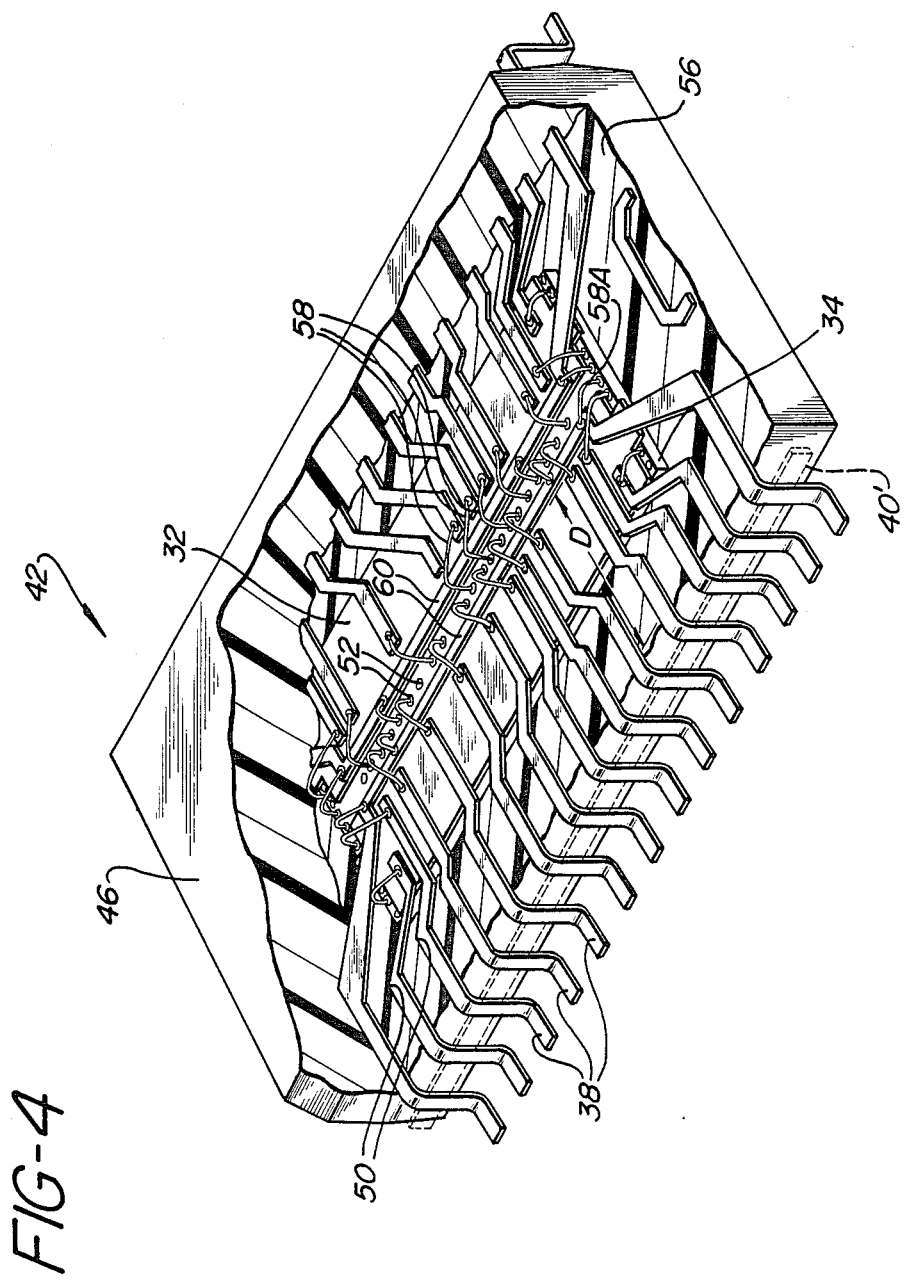
FIG. 4 is a schematic representation of one embodiment of the present invention showing a wire bonded encapsulated semiconductor chip employing the lead frame of the present invention shown in FIG. 3. Part of the encapsulation material has been broken away to expose the conductors, the semiconductor chip, the chip terminals, and the wires used to connect the conductors and the chip terminals.

FIG. 4 shows a package 42 containing a semiconductor chip 34 in which part of the encapsulating material 46 has been removed. After encapsulation, the lead frame selvage 48 and the cross members 40 shown in FIG. 3 are removed. The conductors 38 which extend beyond the package 42 may be formed as required. The removed cross members are partially shown in phantom at 40' in FIG. 4.

The width of the conductors 38 should be minimized to ensure maximum top to bottom encapsulant sealing. The maximization of the encapsulant knitting at the part line 56 enhances crack resistance. Because a minimum path length of about 0.5 mm to 1 mm is needed to assure sealing of the conductors in the encapsulating material.

Encapsulant locking of the lead frame conductors 38 is achieved by providing the conductors 38 with anchors 22 as shown in FIG. 2, or sharp angles or kinks 50 as shown in FIG. 4. By providing the lead frame conductors with kinks the package of the present invention permits the width of the semiconductor module to be reduced while maintaining superior mechanical characteristics since the length of the leads within the packaging material is no longer limited by the distance between the chip and the edge of the package.

The conductors 38 should cover between 30% and 80% of the area of the surface of the semiconductor chip 34, and preferably a maximum percentage of the surface area. The conductors 38 should be positioned to avoid contact with terminal pads 52 on the semiconductor chip 34. This area maximization assures effective enhanced cooling of the semiconductor chip 34 and adequate bonding of the conductors 38 to the surface of semiconductor chip 34. The longer conductors 38 reaching over and adhering to the chip 34 result in a longer path (D) from the package exterior to the wire bonds thus increasing resistance to ingress of environmental contaminants which could produce corrosion and premature failure.

Extraction of heat from the active layer 54 of the semiconductor chip 34 which contains the terminal pads 52 is more effective than extraction of heat from the back side of the semiconductor chip as is done with the packaged semiconductor chips of the prior art.

The terminal pads 52 are connected to the conductors 38 by wires 58. The configuration of the conductors 38 is preferably such that wires 58 are less than about 30 mils long. Minimizing the length of the wires 58 improves the electrical performance of the packaged semiconductor chip.

Coverage of between about 30% and 80% of the active surface 54 is preferred to assure adequate mechanical strength and to provide sufficient thermal conductivity between the conductors 38 and the semiconductor chip 34. In order to facilitate high coverage of the active surface 54 with conductors 38 and to maintain short wires 58 it is preferred that the terminal pads 52 be arranged in rows. Providing a row of centrally located terminal pads 52 reduces the impedance in the chip 34 by reducing conducting channel lengths within the chip. Electrical testing has shown this design to be substantially faster than the peripheral I/O memory counterparts. Furthermore, having the chip terminal pads 52 centrally located aids in bringing conductors 38 into close proximity to a number of chip terminal pads 52 and thus allows alternate wiring configurations since a terminal may be connected to a conductor which is not immediately adjacent while still maintaining short wires. For example, lead 58A in FIG. 4 is shown connected to a nonadjacent finger of lead frame conductors 38. Such an alternative connection capability permits different chips to be packaged with the same electrical I/O specifications.

Having terminal pads 52 located in the central portion of the chip 34 has an additional advantage in that the terminal pads 52 are located over conducting channels which are not affected by alpha particles. Thus the alpha barrier 32 need not cover the central portion of the semiconductor chip 34 which simplifies assembly.

It is further preferred that bus bars 60 be employed which traverse the length of the chip 34 in close proximity to the central line. Multiple connections can be made from the bus bars 60 to the semiconductor chip 34 thereby minimizing the voltage drop through the chip 34. In addition, the bus bars 60 are located over the active surface 54 of the chip known to dissipate over 50% of the heat, and thus the bus bars 60 facilitate cooling. Finite element analysis has shown the structure of FIG. 4 to be thermally superior by 5° C./watt to that depicted using the configuration shown in FIG. 2.

While the novel features of this invention have been described in terms of preferred embodiments and particular applications, it will be appreciated that various omissions and substitutions in form may be made by those skilled in the art without departing from the spirit of the invention.

What is claimed is:

1. An encapsulated semiconductor module comprising:
    a semiconductor chip having a major surface with terminals thereon disposed within an encapsulating material;
    a plurality of self supporting unitary, discrete, and continuous lead frame conductors formed of metal sheet stock extending over and joined with an adhesive in dielectric relationship to said major surface of said chip at spaced locations from said terminals and extending from said chip and cantilevered out of the encapsulating material; and
    discrete electrical conducting means bonded to said conductors and said terminals and electrically connecting said conductors to said terminals.

2. The module of claim 1 further comprising:
    a dielectric layer having two opposed surfaces interposed between said lead frame conductors and the major surface of said chip; and further wherein said dielectric layer is attached by a first adhesive layer on one of its surfaces to said semiconductor chip and is attached by a second adhesive layer on the other of its surfaces to said plurality of conductors.

3. The module of claim 2 wherein said dielectric layer is an alpha barrier.

4. The module of claim 3 wherein said dielectric layer is a film selected from the group of electronic grade polymeric materials.

5. The module of claim 4 wherein said alpha barrier is a polyimide film.

6. The module of claim 4 wherein said first and said second adhesive layers are selected from the group of epoxies, acrylics, silicones and polyimides.

7. The module of claim 4 wherein one or more of said conductors are provided with kinks to mechanically lock said leads within said encapsulating material and with respect to said chip.

8. The module of claim 4 wherein said dielectric layer has a thickness of between about 1.5 and 2.0 mils.

9. The module of claim 6 wherein said first adhesive layer is selected from the group of silicones.

10. The module of claim 6 wherein said second adhesive layer is selected from the group of epoxies and acrylics.

11. The module of claim 5 wherein the encapsulation extends 2 mm or less beyond the edge of said chip.

12. The module of claim 5 wherein said conductors cover between about 30% and 80% of the active surface of said semiconductor chip.

13. The module of claim 5 wherein said wires have average lengths less than approximately 30 mils.

14. The module of claim 1 wherein said terminals are arranged in rows.

15. The module of claim 14 further comprising one or more bus bars attached to one or more lead frame conductors and positioned in close proximity to one or more of said rows of terminals.

16. The module of claim 14 wherein one of said rows is centrally aligned on said chip.

17. The module of claim 14 wherein said centrally aligned row is in close proximity to one or more of said bus bars.

18. An encapsulated semiconductor module comprising;
    a semiconductor chip having terminals thereon disposed within an encapsulating material;
    a plurality of self supporting unitary, discrete, and continuous lead frame conductor and formed of metal sheet stock extending over said chip and positioned to avoid contact with said terminals and extending from said chip and cantilevered out of the encapsulating material;
    an electrically insulating material forming an alpha barrier disposed between said chip and said plurality of lead frame conductors, and attached to said plurality of lead frame conductors and to said semiconductor chip with respective adhesive layers; and discrete electrical conducting wire means respectively bonded to each conductor and each terminal and electrically connecting a respective conductor to a respective terminal.

19. A semiconductor modules comprising;

a semiconductor chip having a major surface, provided with a plurality of integrated circuit devices at least partly embedded in said major surface and terminal pads on said major surface electrically coupled to said devices, an electrically insulating material disposed on and joined to said major surface, a plurality of self supporting unitary, discrete, and continuous lead frame conductors formed of metal sheet stock disposed on and joined to said material and positioned to avoid contact with said terminal pads and cantilevered from said chip, a plurality of discrete wire means bonded to said conductors and said terminal pads and electrically connecting respective ones of said conductors to respective ones of said terminal pads, and an encapsulating material disposed over and enclosing said terminal pads, said electrically insulating material and said plurality of wire means and a portion of said lead frame conductors, the remainder of leads frame conductors cantilevered out of said encapsulating material.

20. A semiconductor module comprising:

a semiconductor chip having a major surface, provided with a plurality of heat generating integrated circuit devices at least partially embedded in said major surface, and with rows of terminals on said major surface electrically coupled to said devices, at least one of said rows being centrally positioned on said major surface, an electrically insulating and thermally conducting material disposed on and joined to said major surface, with a silicone adhesive, said material being substantially free of halides, sodium, potassium and phosphorus, a plurality of conductors disposed on and joined to said material with an epoxy or acrylic adhesive, said plurality of conductors collectively covering between 30% and 80% of said major surface and including at least one bus bar, said bus bar being disposed on said material over those devices that generate a major portion of the heat in said chip, a plurality of means joined to said conductors and to said terminals and electrically connecting respective ones of said conductors to respective ones of said terminals, said means being less than 30 mils in length, and an encapsulating material disposed over and enclosing said terminals, said electrically insulating material and said plurality of means and partially covering at least 0.5 mm of each of said conductors, the remainder of said conductors extending out of said encapsulating material.

* * * * *